(12) United States Patent
Fukushima et al.

(10) Patent No.: US 6,351,007 B1
(45) Date of Patent: Feb. 26, 2002

(54) QUANTUM THIN LINE PRODUCING METHOD AND SEMICONDUCTOR DEVICE EMPLOYING THE QUANTUM THIN LINE

(75) Inventors: Yasumori Fukushima, Sakurai; Tsutomu Ashida, Yamatokooriyama, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/501,575

(22) Filed: Feb. 10, 2000

(30) Foreign Application Priority Data

Feb. 10, 1999 (JP) .......................................... 11-032735

(51) Int. Cl.[7] ........................ H01L 29/76; H01L 29/788
(52) U.S. Cl. ........................ 257/314; 257/315; 257/316; 257/317; 257/318; 257/319; 257/320; 257/14; 437/201; 437/211; 437/257; 437/260; 437/266
(58) Field of Search ................................. 257/314, 315, 257/316–320, 14; 438/201, 211, 257, 266

(56) References Cited

U.S. PATENT DOCUMENTS 6,103,600 A * 8/2000 Ueda et al. ................. 438/503

FOREIGN PATENT DOCUMENTS

JP 5-29632 A 2/1993
JP 8-288499 A 11/1996

* cited by examiner

Primary Examiner—Steven Loke
Assistant Examiner—Donghee Kang
(74) Attorney, Agent, or Firm—Nixon & Vanderhye, P.C.

(57) ABSTRACT

There is provided a quantum thin line producing method capable of forming a quantum thin line that has good surface flatness of silicon even after formation of quantum thin line and a complete electron confining region with good controllability as well as a semiconductor device employing the quantum thin line. A region of a nitride film 3 which covers a semiconductor substrate 1 on which a stepped portion 2 is formed is etched back with masking, consequently exposing an upper portion of a semiconductor substrate 1. Next, an oxide film 5 is formed by oxidizing the exposed portion of the upper portion of the semiconductor substrate 1, and a linear protruding portion 6 is formed on the semiconductor substrate along a side surface of the nitride film 3. Next, the oxide film 5 on the protruding portion 6 is partially etched to expose a tip of the protruding portion 6. Next, a thin line portion 7 is made to epitaxially grow on the exposed portion at the tip of the protruding portion 6. Then, after removing the nitride film 3 and the oxide film 5, there is formed a quantum thin line 7a that is insulated and isolated from the semiconductor substrate 1 by an oxide film 5A formed through oxidation of the semiconductor substrate 1.

3 Claims, 11 Drawing Sheets

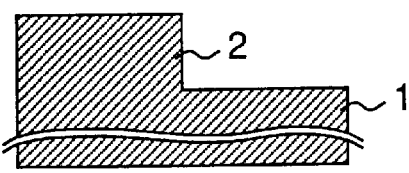
Fig.1A
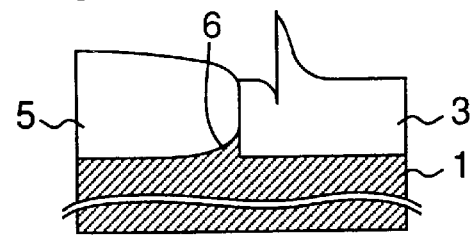
Fig.1E
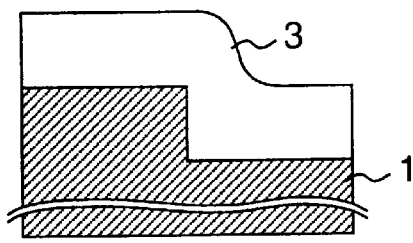
Fig.1B
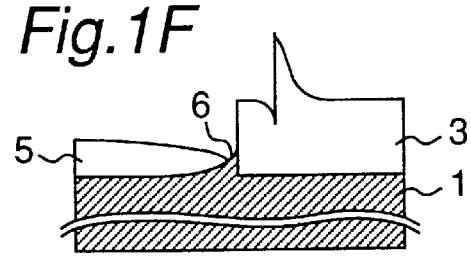
Fig.1F
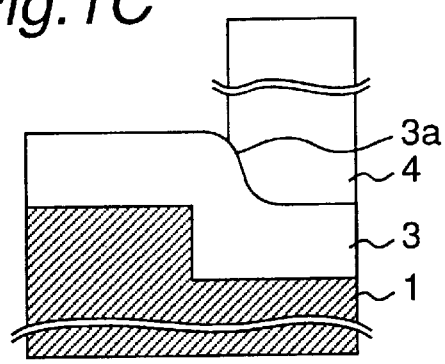
Fig.1C
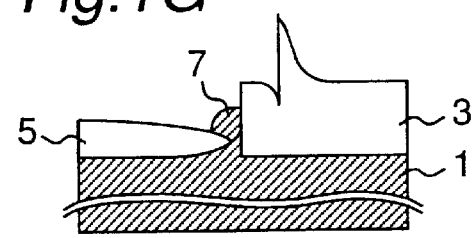
Fig.1G
Fig.1H
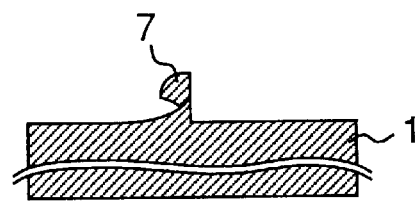
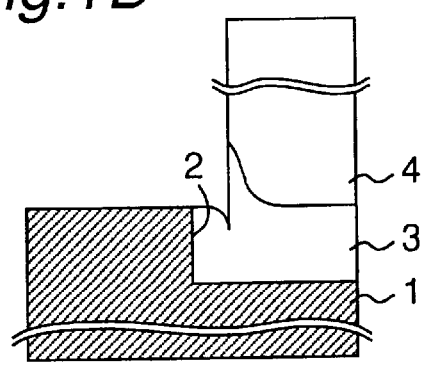
Fig.1D
Fig.1I
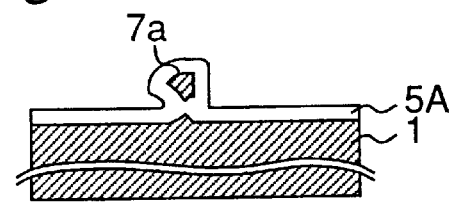

QUANTUM THIN LINE PRODUCING METHOD AND SEMICONDUCTOR DEVICE EMPLOYING THE QUANTUM THIN LINE

BACKGROUND OF THE INVENTION

The present invention relates to a method for producing a minute particle or a quantum thin line constructed of a metal or semiconductor that is minute enough to cause a quantum size effect on an insulating substrate or a semiconductor substrate via an insulating layer and to a semiconductor device that employs a quantum thin line utilized as a single electron device or a quantum effect device.

The large-scale integrated circuits (LSIs) that have supported the development of electronics and currently become the industrial nucleus have made great strides in terms of their performances toward larger capacity, higher speed, lower consumption of power and so on through the microstructural progress thereof. However, it is considered that the conventional device reaches the limit in terms of the principle of operation when the device size becomes 0.1 µm or smaller, and accordingly, there are conducted energetic researches on a new device based on a new principle of operation. As to this new device, there is a device having a microstructure called the nanometer-size quantum dot or quantum thin line. The nanometer-size quantum dot is energetically examined together with a variety of quantum effect devices, particularly for the application thereof to a single electron device utilizing the Coulomb blockade phenomenon. The nanometer-size quantum thin line is expected to be applied to a super-high-speed transistor utilizing the quantum effect.

Particularly, in regard to the quantum thin line, there is carried out trial production of a semiconductor quantum device based on a new principle of operation that the degree of freedom of an electron is limited by confining the electron in a semiconductor layer having a width approximately equal to that of the electron wavelength (de Broglie wavelength) in a semiconductor crystal and a quantization phenomenon caused by this is utilized. The wavelength of an electron in a semiconductor layer is about 10 nm. Therefore, it is theoretically derived that, if an electron is confined in a semiconductor thin line (quantum thin line) having a width of about 10 nm, then the electron can move in this thin line while being scarcely scattered, for the achievement of the increased mobility of the electron. By forming a conductive layer in which a number of quantum thin lines as described above are arranged in a plane and controlling the number of electrons inside this layer by the operation of a gate electrode, there can be produced a quantum thin line transistor having a higher operating speed than that of the conventional transistor. By incorporating a number of the above quantum thin lines into a laser light emitting layer, there can be obtained a semiconductor laser device that has a sharp spectrum, high-efficiency and excellent high-frequency characteristics even with a small injection current.

Conventionally, as a method for forming a quantum thin line, there have been proposed methods as disclosed in the following reference documents (1) and (2).

(1) Japanese Patent Laid-Open Publication No. HEI 5-29632

FIGS. 15A through 15F are process charts showing the "Method for producing silicon quantum thin line on silicon substrate utilizing anisotropic etching" disclosed in the above reference document (1).

First, as shown in FIG. 15A, an etching mask 112 made from a silicon oxide film or a silicon nitride film is formed on a silicon (100)-substrate 111. Next, as shown in FIG. 15B, the silicon (100)-substrate is etched by using a silicon anisotropic etching liquid of potassium hydroxide water and so on having an etching rate characteristic that largely varies depending on the orientation of silicon. Since the etching rate of the (111) plane is slower than the etching rate of the (110) plane and (100) plane by about two orders of magnitude, a projecting portion having a triangular cross-section shape is formed on the surface of the silicon (100)-substrate 111 after etching.

Next, as shown in FIG. 15C, after the removal of the etching mask 112 (shown in FIG. 15B), a silicon nitride film 113 that becomes an oxidation-resistant mask layer is formed, and thereafter a resist pattern 114 is formed so as to cover at least the top of the projecting portion having a triangular cross-section shape.

Next, as shown in FIG. 15D, the silicon nitride film 113 is etched using a resist 114 as a mask, and further the silicon (100)-substrate 111 is subjected to isotropic etching.

Next, as shown in FIG. 15E, after the removal of the resist 114 (shown in FIG. 15D), the silicon (100)-substrate 111 is oxidized to form an oxide film 116. In this stage, the silicon nitride film 113 serves as the oxidation-resistant mask, and therefore, a portion in the vicinity (indicated by the reference numeral 115 in FIG. 15E) of the top of the projecting portion having a triangular cross-section shape is not oxidized.

Finally, as shown in FIG. 15F, if the silicon nitride film 113 (shown in FIG. 15E) is removed, then a silicon thin line 115 that is insulated and isolated from the silicon (100)-substrate 111 by the oxide film 116 is formed at the top of the projecting portion having a triangular cross-section shape.

(2) Japanese Patent Laid-Open Publication No. HEI 8-288499

FIGS. 16A through 16G are process charts showing the "Quantum thin line forming method utilizing sticking of two silicon wafers and etching mask composed of aside wall" disclosed in the above reference document (2).

First, as shown in FIG. 16A, a projecting portion 122 having a thickness of about 10 nm is formed on a silicon substrate 121 by dry etching.

Subsequently, as shown in FIG. 16B, a SiOx-based insulating film 123 is formed so as to flatten the entire substrate.

Next, as shown in FIG. 16C, the substrate is inverted from the state shown in FIG. 16B and stuck on another silicon substrate 124 with the surface of the SiOx-based insulating film 123 put in contact with the silicon substrate 124.

Next, as shown in FIG. 16D, the silicon substrate 121 (shown in FIG. 16C) is abraded by the CMP (Chemical Mechanical Polishing) method until the SiOx-based insulating film 123 is exposed. In this case, an island-shaped silicon layer 125 is left as buried in the SiOx-based insulating film 123.

Next, by forming a polysilicon layer including an impurity to a thickness of about 10 nm by the thermal CVD (Chemical Vapor Deposition) method and thereafter performing anisotropic etching via a resist mask, there is formed a polysilicon pattern 126 where the processed end surface is positioned in the vicinity of the center of the island-shaped silicon layer 125.

Next, as shown in FIG. 16E, a thermo-oxidized film 127 having a film thickness of 1 to 10 nm is formed on the exposed portion of the island-shaped silicon layer 125 and the polysilicon pattern 126 through a thermo-oxidizing process.

Next, as shown in FIG. 16F, a side wall 128 is formed on the processed end surface of the polysilicon pattern 126 by etchback.

Next, as shown in FIG. 16G, wet processing is performed on condition that a selection ratio relative to the island-shaped silicon 125 can be assured, consequently removing the polysilicon pattern 126 (shown in FIG. 16F). Subsequently, the island-shaped silicon 125 (shown in FIG. 16F) is etched on condition that the selection ratio relative to a SiOx side wall 128 can be assured, consequently forming a quantum thin line 129.

The aforementioned prior art techniques (1) and (2) have the problems as follows.

(1) According to the "Method for producing silicon quantum thin line on silicon substrate utilizing anisotropic etching" of the aforementioned reference document of Japanese Patent Laid-Open Publication No. HEI 5-29632, the silicon thin line is formed at the top of the silicon substrate having a triangular cross-section shape. Therefore, the surface flatness of the silicon substrate becomes degraded as a consequence of an increase in size of the stepped portion on the silicon substrate. This results in a difficulty in forming a single-electron transistor.

(2) According to the "Quantum thin line forming method utilizing sticking of two silicon wafers and etching mask composed of side wall" of the aforementioned reference document of Japanese Patent Laid-Open Publication No. HEI 8-288499, there are needed two silicon substrates as well as the special substrate forming technique of sticking two silicon substrates on each other via an insulating layer. The height of the quantum thin line is determined depending on the dry etching depth of the silicon substrate via the resist mask, and it is difficult to control the dry etching depth in nanometer size in the above case.

SUMMARY OF THE INVENTION

Accordingly, the object of the present invention is to provide a quantum thin line producing method capable of easily forming a single electron transistor that employs a quantum thin line and has good surface flatness of the silicon surface obtained through quantum thin line formation and of forming a quantum thin line having a complete electron confining region with good controllability using one semiconductor substrate of a silicon substrate, a GaAs substrate or the like without using any special substrate forming technique as well as a semiconductor device employing the quantum thin line.

In order to achieve the aforementioned object, according to the first aspect of the present invention, there is provided a quantum thin line producing method comprising the steps of:

forming a stepped portion on a semiconductor substrate;

forming a nitride film on an upper portion and a lower portion of the semiconductor substrate by which the stepped portion is formed;

masking a region of the nitride film which covers the lower portion of the semiconductor substrate and etching back the nitride film, consequently exposing the upper portion of the semiconductor substrate;

forming a first oxide film by oxidizing the exposed upper portion of the semiconductor substrate and forming a linear protruding portion on the semiconductor substrate along a side surface of the nitride film;

partially etching the first oxide film located on the protruding portion of the semiconductor substrate, consequently exposing a tip of the protruding portion;

epitaxially growing a thin line portion on an exposed region of the tip of the protruding portion of the semiconductor substrate;

removing the nitride film and the first oxide film after the epitaxial growth of the thin line portion; and forming a quantum thin line isolated from the semiconductor substrate by a second oxide film formed by oxidizing the semiconductor substrate after the removal of the nitride film and the first oxide film.

According to the quantum thin line producing method of the present invention, the linear protruding portion can be formed on the semiconductor substrate by means of the general film forming technique, lithographic technique and etching technique, and the exposed region can be formed at the tip of the protruding portion. This enables the positional control of the quantum thin line and the formation of the quantum thin line on a relatively flat semiconductor substrate. Therefore, a single electron transistor can be easily formed. Since no special fine processing technique is used, there can be provided a quantum thin line producing method of a high yield and high productivity appropriate for mass production at reduced producing cost.

According to the second aspect of the present invention, there is provided a quantum thin line producing method comprising the steps of:

forming a stepped portion on a semiconductor substrate;

forming a first nitride film on an upper portion and a lower portion of the semiconductor substrate by which the stepped portion is formed;

masking a region of the first nitride film which covers the lower portion of the semiconductor substrate and etching back the first nitride film, consequently exposing the upper portion of the semiconductor substrate;

forming a second nitride film on the exposed upper portion of the semiconductor substrate and the first nitride film and then performing etching back, consequently exposing the upper portion of the semiconductor substrate;

forming a first oxide film by oxidizing the exposed upper portion of the semiconductor substrate and forming a linear protruding portion on the semiconductor substrate along a side surface of the first nitride film;

partially etching the first oxide film located on the protruding portion of the semiconductor substrate, consequently exposing a tip of the protruding portion;

epitaxially growing a thin line portion on an exposed region located at a tip of the protruding portion of the semiconductor substrate;

removing the first and second nitride films and the first oxide film after the epitaxial growth of the thin line portion; and forming a quantum thin line isolated from the semiconductor substrate by a second oxide film formed by oxidizing the semiconductor substrate after the removal of the first and second nitride films and the first oxide film.

According to the above quantum thin line producing method, the linear protruding portion can be formed on the semiconductor substrate by means of the general film forming technique, lithographic technique and etching technique, and the exposed region can be formed at the tip of the protruding portion. This enables the positional control of the quantum thin line and the formation of the quantum thin line on a relatively flat semiconductor substrate. Therefore, a single electron transistor can be easily formed. Since no special fine processing technique is used, there can be provided a quantum thin line producing method of a high yield and high productivity appropriate for mass production at reduced producing cost. Furthermore, the formation and etchback of the second nitride film are performed after the dry etching of the first nitride film, and therefore, the positional control margin of the photoresist during the etching of the first nitride film can be approximately doubled.

According to the third aspect of the present invention, there is provided a quantum thin line producing method comprising the steps of:

forming a groove having a rectangular cross-section shape on a semiconductor substrate;

forming a nitride film on the semiconductor substrate on which the groove is formed;

etching back the nitride film, consequently exposing both side portions of the semiconductor substrate located on both sides of the groove;

forming a first oxide film by oxidizing the exposed region of the semiconductor substrate located on both sides of the groove and forming linear protruding portions on the semiconductor substrate along both side surfaces of the first nitride film;

partially etching the first oxide film located on both protruding portions of the semiconductor substrate, consequently exposing tips of both the protruding portions;

epitaxially growing thin line portions on exposed portions located at the tips of both the protruding portions of the semiconductor substrate;

removing the nitride film and the first oxide film after the epitaxial growth of the thin line portions; and forming quantum thin lines isolated from the semiconductor substrate by a second oxide film formed by oxidizing the semiconductor substrate after the removal of the nitride film and the first oxide film.

According to the above quantum thin line producing method, the linear protruding portion can be formed on the semiconductor substrate by means of the general film forming technique, lithographic technique and etching technique, and the exposed region can be formed at the tip of the protruding portion. This enables the positional control of the quantum thin line and the formation of the quantum thin line on a relatively flat semiconductor substrate. Therefore, a single electron transistor can be easily formed. Since no special fine processing technique is used, there can be provided a quantum thin line producing method of a high yield and high productivity appropriate for mass production at reduced producing cost. Furthermore, there can be eliminated the process for forming a resist in the region above the groove portion of the nitride film before the etchback of the nitride film and forming a mask.

According to one embodiment, the step for epitaxially growing the thin line portion in the exposed region located at the tip of the protruding portion of the semiconductor substrate comprises: introducing the semiconductor substrate into a reaction chamber and discharging air inside the reaction chamber so that the reaction chamber comes to have a high vacuum of not higher than $10^{-6}$ Torr; and thereafter flowing a material gas into the reaction chamber so as to perform vapor growth of the thin line portion under a material gas partial pressure of not higher than $10^{-2}$ Torr.

According to the quantum thin line producing method of the above embodiment, after introducing the semiconductor substrate into the reaction chamber and the atmospheric components and the impurities of moisture component and the like are discharged so that the reaction chamber comes to once have a high vacuum of not higher than $10^{6}$ Torr, allowing the epitaxial growth in the highly clean environment to be promoted. Thereafter, by flowing a material gas and setting the material gas partial pressure to $10^{-2}$ Torr or lower, vapor growth is performed only in the exposed region at the tip or top of the semiconductor substrate where the thin line portion grows. If the material gas partial pressure exceeds $10^{-2}$ Torr in this stage of reaction, then the film growth rapidly starts on the entire surface of the insulating thin film, failing in achieving selective growth. Therefore, by controlling the degree of vacuum inside the reaction chamber, the amount of material gas to be introduced, the time of introduction, the substrate temperature and so on by means of a general high-vacuum CVD apparatus, the quantum thin line of the desired size is formed with high reproducibility.

In one embodiment, the quantum thin line is made of silicon and, any one of monosilane ($SiH_4$), disilane ($Si_2H_6$), trisilane ($Si_3H_8$), dichlorosilane ($SiH_2Cl_2$) and tetrachlorosilane ($SiCl_4$) is used as a material gas.

According to the quantum thin line producing method of the above embodiment, a quantum thin line made of silicon can be formed only in the exposed region located at the tip of the protruding portion of the semiconductor substrate by using any one of monosilane ($SiH_4$), disilane ($Si_2H_6$), trisilane ($Si_3H_8$), dichlorosilane ($SiH_2Cl_2$) and tetrachlorosilane ($SiCl_4$) as a material gas and causing reaction by means of the general CVD apparatus.

In one embodiment, the quantum thin line is made of germanium and, any one of monogermane ($GeH_4$), digermane ($Ge_2H_6$) and germanium tetrafluoride ($GeF_4$) is used as a material gas.

According to the quantum thin line producing method of the above embodiment, a quantum thin line made of germanium can be formed only in the exposed region located at the tip of the protruding portion of the semiconductor substrate by using any one of monogermane ($GeH_4$), digermane ($Ge_2H_6$) and germanium tetrafluoride ($GeF_4$) as a material gas and causing reaction by means of the general CVD apparatus.

In one embodiment, the quantum thin line is made of silicon germanium and, a mixed gas comprised of a gas of any one of monosilane ($SiH_4$), disilane ($Si_2H_6$), trisilane ($Si_3H_8$), dichlorosilane ($SiH_2Cl_2$) and tetrachlorosilane ($SiCl_4$) and a gas of any one of monogermane ($GeH_4$), digermane ($Ge_2H_6$) and germanium tetrafluoride ($GeF_4$) is used as a material gas.

According to the quantum thin line producing method of the above embodiment, a quantum thin line made of silicon germanium can be formed only in the exposed region located at the tip of the protruding portion of the semiconductor substrate by using a mixed gas comprised of a gas of any one of monosilane ($SiH_4$), disilane ($Si_2H_6$), trisilane ($Si_3H_8$), dichlorosilane ($SiH_2Cl_2$) and tetrachlorosilane ($SiCl_4$) and a gas of any one of monogermane ($GeH_4$), digermane ($Ge_2H_6$) and germanium tetrafluoride ($GeF_4$) as a material gas and causing reaction by means of the general CVD apparatus.

In one embodiment, the quantum thin line is made of aluminum and, an organic aluminum is used as a material.

According to the quantum thin line producing method of the above embodiment, the quantum thin line made of aluminum can be formed only in the exposed region located at the tip of the protruding portion of the semiconductor substrate by using an organic aluminum of dimethyl aluminum hydride (DMAH: $(CH_3)_2AlH$) or the like as a material and causing reaction by means of the general CVD apparatus.

One embodiment provides a semiconductor device having a source region, a drain region, a channel region located between the source region and the drain region, a gate region for controlling a channel current flowing through the channel region, a floating gate region located between the channel region and the gate region, a first insulating film located between the floating gate region and the gate region and a second insulating film located between the channel region and the floating gate region, the floating gate region being comprised of a quantum thin line formed by the quantum thin line producing method.

According to the semiconductor device employing the quantum thin line of the above embodiment, the quantum thin line made of a semiconductor (or metal) formed by the above quantum thin line producing method is made to serve as the floating gate region. With this arrangement, the electric charge accumulation is reduced, and the amount of electric charges to be injected into the floating gate region can be reduced. This enables the obtainment of a non-volatile memory of a small consumption of power, a high density and a large capacity. A non-volatile memory of a high yield and high productivity appropriate for mass production can be obtained at low cost. Furthermore, the semiconductor device employing the quantum thin line of the embodiment can be mounted on the same substrate as that of a silicon-based large-scale integrated circuit as a semiconductor device having a quantum thin line that becomes the basis of a single electron device.

One embodiment provides a semiconductor device having a source region, a drain region, a channel region located between the source region and the drain region, a gate region for controlling a channel current flowing through the channel region and a gate insulating film located between the channel region and the gate region, the channel region being comprised of a quantum thin line formed by the quantum thin line producing method.

According to the semiconductor device employing the quantum thin line of the above embodiment, the quantum thin line made of a semiconductor (or metal) formed by the above quantum thin line producing method is made to serve as the channel region. With this arrangement, the channel region is quantized in the direction perpendicular to the lengthwise direction of the quantum thin line, exhibiting linear conduction. This enables the obtainment of a transistor that can operate at a super high speed and the provision of a low-cost super-high-speed transistor of a high yield and high productivity appropriate for mass production. The semiconductor device employing the quantum thin line of the embodiment can be mounted on the same substrate as that of a silicon-based large-scale integrated circuit serving as a semiconductor device having a quantum thin line that becomes the basis of a quantum effect device.

One embodiment provides a semiconductor device comprising: a quantum thin line formed by the quantum thin line producing method; an insulating film formed with interposition of the quantum thin line; and electrodes formed to sandwich the insulating film, wherein the quantum thin line emits light when a voltage is applied across the electrodes.

According to the semiconductor device employing the quantum thin line of the above embodiment, by virtue of the quantum confining effect obtained by interposing the quantum thin line formed by the aforementioned quantum thin line producing method between the insulating film portions and further interposing the insulating film portions between the electrodes, the quantum thin line comes to have a direct transition type band structure. If a voltage is applied across the electrodes to flow a tunnel current for the injection of electrons into the quantum thin line, then electron transition occurs in the quantum thin line, causing light emission. Therefore, a light-emitting device of a high yield and high productivity appropriate for mass production can be provided at low cost. Furthermore, the semiconductor device employing the quantum thin line of the embodiment can be mounted on the same substrate as that of a silicon-based large-scale integrated circuit as a semiconductor device having a quantum thin line that becomes the basis of a quantum effect device or a single electron device. By applying this semiconductor device to a light-emitting device or a photoelectric transducing device, an electronic circuit and an optical communication circuit can be combined with each other.

One embodiment provides a semiconductor device provided with a quantum thin line which is formed by the quantum thin line producing method and of which one portion is an n-type semiconductor and the other portion is a p-type semiconductor, wherein the quantum thin line emits light when a voltage is applied across the n-type semiconductor portion and the p-type semiconductor portion of the quantum thin line.

According to the semiconductor device employing the quantum thin line of the above embodiment, one portion of the quantum thin line formed by the aforementioned quantum thin line producing method is constructed of the n-type semiconductor and the other portion of the quantum thin line is constructed of the p-type semiconductor. The quantum thin line has a direct transition type band structure by virtue of the quantum confining effect, and a pn junction is formed in the boundary region located between the n-type semiconductor and the p-type semiconductor of the quantum thin line. Therefore, by applying a voltage across the n-type semiconductor and the p-type semiconductor, reunion of an electron with a hole occurs in the pn junction portion, causing light emission. Therefore, a light-emitting device of a high yield and high productivity appropriate for mass production can be provided at low cost. Furthermore, the semiconductor device employing the quantum thin line of the embodiment can be mounted on the same substrate as that of a silicon-based large-scale integrated circuit as a semiconductor device having a quantum thin line that becomes the basis of a quantum effect device or a single electron device. By applying this semiconductor device to a light-emitting device or a photoelectric transducing device, an electronic circuit and an optical communication circuit can be combined with each other.

One embodiment provides a semiconductor device provided with three or more quantum thin lines formed roughly parallel to one another at set intervals by the quantum thin line producing method, wherein a semiconductor forbidden bandwidth of any one of the three or more quantum thin lines, the one quantum thin line being located inside, is made smaller than an energy gap of the forbidden bandwidth of the quantum thin lines located on both sides of the one quantum thin line, and wherein the quantum thin line located inside the quantum thin lines located on both sides emits light when a voltage is applied across the quantum thin lines located on both sides.

According to the semiconductor device employing the quantum thin line of the above embodiment, the semiconductor forbidden bandwidth of any one of the three or more quantum thin lines formed by the aforementioned quantum thin line producing method, the one quantum thin line being located inside, is made smaller than the energy gap of the forbidden bandwidth of the quantum thin lines located on both sides of the one quantum thin line. The quantum thin line comes to have the direct transition type band structure by virtue of the quantum confining effect and also the double hetero structure in which the efficiency of reunion of an electron with a hole is high. Therefore, by applying a voltage across the quantum thin lines located on both sides, the reunion of an electron with a hole occurs in the quantum thin line which is located inside and the energy gap of the forbidden bandwidth of which is small, causing light emission. Therefore, a light-emitting device of a high yield and high productivity appropriate for mass production can be provided at low cost. Furthermore, the semiconductor device employing the quantum thin line of the embodiment can be mounted on the same substrate as that of a silicon-based large-scale integrated circuit as a semiconductor device having a quantum thin line that becomes the basis of a quantum effect device or a single electron device. By applying this semiconductor device to a light-emitting device or a photoelectric transducing device, an electronic circuit and an optical communication circuit can be combined with each other.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 1A through 1I are process charts showing a quantum thin line producing method according to a first embodiment of the present invention;

DETAILED DESCRIPTION OF THE PREFERRED EMBODIMENTS

Figure 2A:
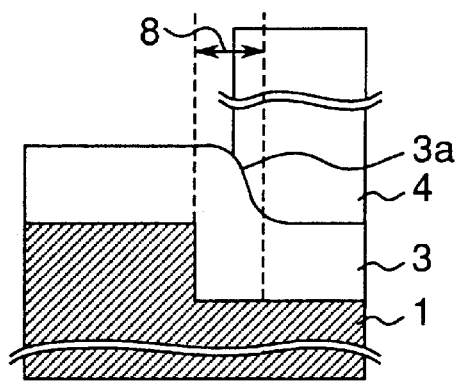
FIGS. 2A through 2E are process charts showing a quantum thin line producing method according to a second embodiment of the present invention.

The quantum thin line producing method of the present invention and the semiconductor device employing the quantum thin line will be described in detail below on the basis of the embodiments thereof shown in the drawings.

First Embodiment

FIGS. 1A through 1I are process charts showing a quantum thin line producing method according to the first embodiment of the present invention.

First, as shown in FIG. 1A, a silicon substrate 1 is patterned and thereafter etched, forming a stepped portion 2 having a difference in level of, for example, 100 nm.

Next, as shown in FIG. 1B, a nitride film 3 having a film thickness of, for example, 100 nm is formed on the silicon substrate 1 by the CVD method or the like.

Next, as shown in FIG. 1C, a photoresist pattern 4 is formed so that its end surface is positioned on the stepped portion 3a of the nitride film 3.

Next, as shown in FIG. 1D, the nitride film 3 is removed by anisotropic etching using the resist pattern 4 as a mask. In this case, the region of the nitride film 3 below the photoresist 4 is left intact without being etched, and the nitride film 3 put in contact with the stepped portion 2 comes to have a shape like a side wall. In this case, the photoresist pattern 4 is formed so that its end surface is positioned on the stepped portion 3a of the first nitride film 3 as shown in FIG. 1C, the portion in the vicinity of the stepped portion 2 that belongs to the nitride film 3 and is most deeply etched to have a side-wall-like shape does not reach the silicon substrate 1.

Next, as shown in FIG. 1E, the upper portion of the silicon substrate 1 being not covered with the nitride film 3 among the upper portion and the lower portion that form the stepped portion 2 of the silicon substrate 1 is oxidized, forming an oxide film 5. In this case, with regard to the oxidation of the stepped portion 2 (shown in FIG. 1D), the diffusion of oxidation seed is suppressed by the nitride film 3, and therefore, a linear protruding portion 6 is left along the side surface of the nitride film 3.

Next, as shown in FIG. 1F, the oxide film 5 is etched by, for example, wet etching, consequently exposing the tip or top of the linear protruding portion 6.

Next, as shown in FIG. 1G, the substrate is placed in a reaction chamber of a high-vacuum CVD (Chemical Vapor Deposition) apparatus, and thereafter air inside the reaction chamber is discharged until a vacuum of not higher than about $10^{-6}$ Torr is attained. Thereafter, by supplying silane ($SiH_4$) or disilane ($Si_2H_6$) gas therein with the substrate temperature set to about 550° C. to 600° C., a silicon thin line 7 is made to epitaxially grow on the exposed region located at the top of the protruding portion 6 (shown in FIG. 1F). In this case, it is required to isolate the silicon thin line 7 from the silicon substrate 1 by oxidation in the subsequent process, and therefore, the silicon thin line 7 is made to grow wider than the width of the connection portion of the silicon substrate 1.

Next, as shown in FIG. 1H, the nitride film 3 and the oxide film 5 are removed by wet etching with hydrofluoric acid, phosphoric acid or the like.

Finally, as shown in FIG. 1I, oxidation is performed to form an oxide film 5A between the silicon thin line 7 (shown in FIG. 1H) and the silicon substrate 1, a silicon quantum thin line 7a isolated from the silicon substrate 1 is formed.

As described above, the linear protruding portion 6 is formed on the silicon substrate 1 by the general film forming technique, lithographic technique and etching technique, and the exposed region can be formed at the top of the protruding portion 6. This enables the positional control of the silicon quantum thin line 7a and the formation of a quantum thin line on the relatively flat semiconductor substrate. Since no special fine processing technique is used, there can be provided a quantum thin line producing method of a high yield and high productivity appropriate for mass production at reduced producing cost.

Second Embodiment

FIGS. 2A through 2E are process charts showing a quantum thin line producing method according to the second embodiment of the present invention.

First, when forming the photoresist 4 for patterning the first nitride film 3 in FIG. 1C of the first embodiment, its end surface is required to be positioned on the stepped portion 3a of the first nitride film 3. That is, in FIG. 2A, the end surface of the photoresist 4 is required to be located within a positional control margin 8 of the stepped portion 3a of the first nitride film 3. It is a matter of course that the film thickness of the first nitride film 3 is made thick so that the end surface of the photoresist pattern can be positioned on the stepped portion 3a of the first nitride film 3 utilizing the accuracy in positioning the end surface of the photoresist pattern according to the conventional LSI technique in the first embodiment.

In the second embodiment of the present invention, the width of the positional control margin of the end surface of the photoresist 4 for patterning the first nitride film 3 is made about double that of the first embodiment.

First, the processes in the early stages are the same as those shown in FIGS. 1A and 1B of the first embodiment.

Figure 2E:
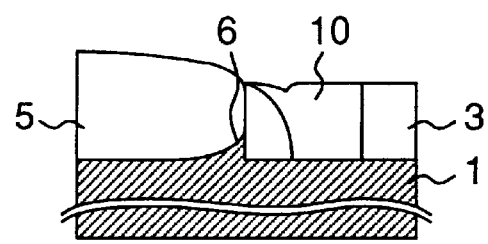
Figure 2B:
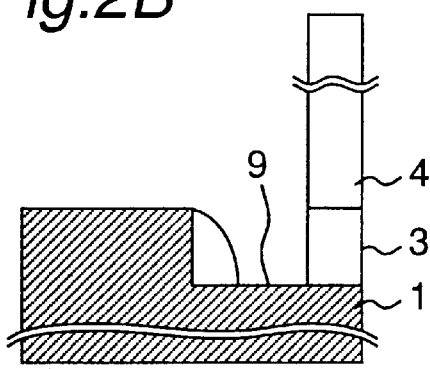

Next, in the case where the end surface of the photoresist pattern 4 is located on the right-hand side of the positional control margin 8 (shown in FIG. 2A) as shown in FIG. 2B subsequent to FIG. 1B, if the first nitride film 3 is subjected to dry etching using the photoresist 4 for patterning the first nitride film 3 as a mask, then an exposed portion 9 of the silicon substrate 1 is formed. If the processing should proceed in conformity to the first embodiment, then silicon would be made to epitaxially grow also on the exposed portion 9 of the silicon substrate 1. Therefore, the exposed portion 9 is filled up in the next process.

Figure 2C:
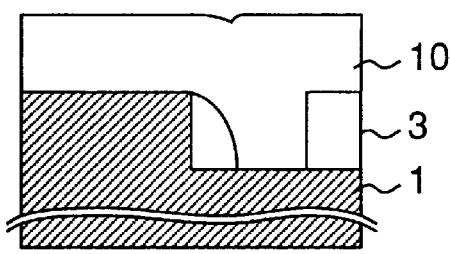

That is, as shown in FIG. 2C, after the removal of the photoresist 4 (shown in FIG. 2B), a second nitride film 10 having a film thickness of, for example, 100 nm is formed on the silicon substrate 1. In this stage, by appropriately varying the film thickness of the second nitride film 10 according to the width of the exposed portion 9 (shown in FIG. 2B) of the silicon substrate 1, the surface unevenness after the formation of the second nitride film 10 can be reduced.

Figure 2D:
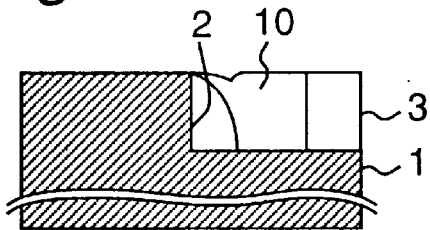

Subsequently, as shown in FIG. 2D, the second nitride film is etched back so that the upper portion among the upper portion and the lower portion that form the stepped portion 2 of the silicon substrate 1 is exposed.

Subsequently, as shown in FIG. 2E, the upper portion of the silicon substrate 1 being not covered with the second nitride film 10 is oxidized to form an oxide film 5. In this stage, similarly to the first embodiment, with regard to the oxidation of the upper portion of the silicon substrate 1, the diffusion of the oxidation seed is suppressed by the first nitride film 3, and therefore, the linear protruding portion 6 is left along the side surface of the first nitride film 3.

By performing the subsequent processes similarly to the processes shown in FIG. 1F through 1I, a silicon quantum thin line can be formed.

As described above, the second embodiment produces the same effect as that of the first embodiment and the positional control margin of the end surface of the photoresist 4 can be made about double that of the first embodiment.

Third Embodiment

FIGS. 3A through 3h are process charts showing a quantum thin line producing method according to the third embodiment of the present invention.

First, according to either one of the first and second embodiments, the photoresist is required to be formed in the position within the predetermined range from the stepped portion of the silicon substrate, for the patterning of the first nitride film.

According to the third embodiment of the present invention, the process of forming the photoresist for patterning the first nitride film is not needed, and therefore, the processes can be simplified.

Figure 3A:
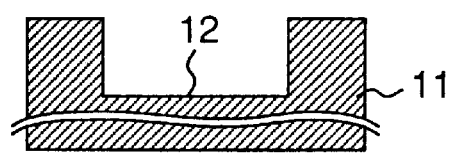
FIGS. 3A through 3H are process charts showing a quantum thin line producing method according to a third embodiment of the present invention.

First, in an early stage, as shown in FIG. 3A, a silicon substrate 11 is patterned and subjected to silicon etching, consequently forming a groove 12 having a rectangular cross-section shape.

Figure 3F:
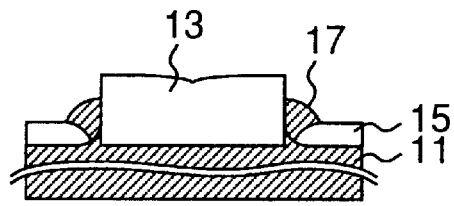
Figure 3B:
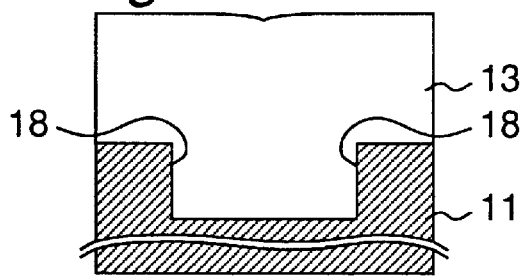

Next, as shown in FIG. 3B, a nitride film 13 is formed on the silicon substrate 11. In this stage, the film thickness of the nitride film 13 is made thick to the extent that the stepped portion of the nitride film 13 caused by the stepped portions 18 and 18 on both sides of the groove 12 disappears. For example, assuming that the width of the groove 12 formed on the silicon substrate 11 is 0.2 µm, then the film thickness of the nitride film 13 is set not smaller than about three fourths of the width, i.e., not smaller than 0.15 µm.

Figure 3G:
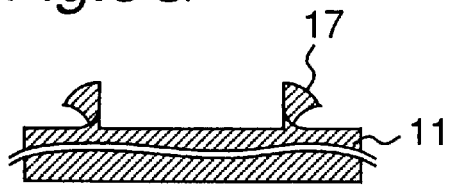
Figure 3C:
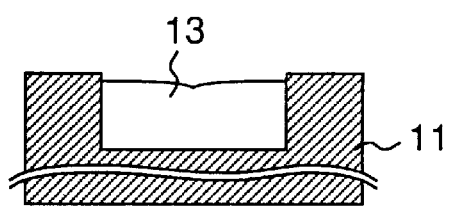

Subsequently, as shown in FIG. 3C, the nitride film 13 is etched back to expose both side portions of the silicon substrate 11 positioned on both sides of the groove 12.

Figure 3H:
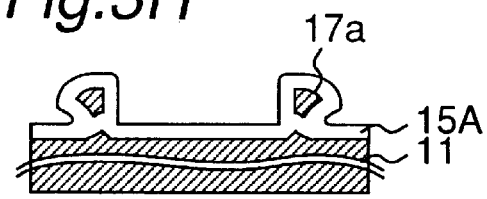
Figure 3D:
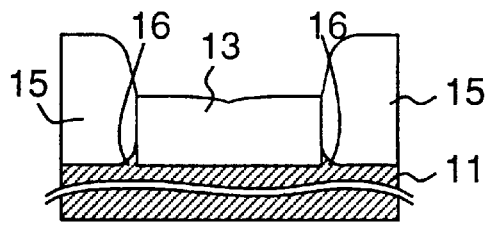

Next, as shown in FIG. 3D, an oxide film 15 is formed by oxidizing the both side portions of the groove 12 of the silicon substrate 11. In this stage, similarly to the first embodiment, with regard to the oxidation of the bottom portion of the groove 12 (shown in FIG. 3A) of the silicon substrate 11, the diffusion of the oxidation seed is suppressed by the nitride film 13, and therefore, linear protruding portions 16 and 16 are left in the vicinity of both side portions at the bottom of the groove 12.

Figure 3E:
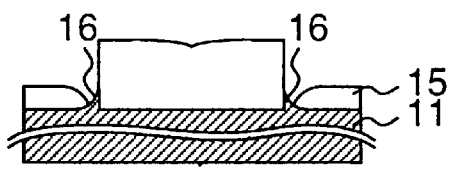

Next, as shown in FIG. 3E, the oxide film 15 is subjected to wet etching, consequently exposing only a portion of the tips of the protruding portions 16 and 16.

Next, as shown in FIG. 3F, the substrate is placed in a reaction chamber of a high-vacuum CVD (Chemical Vapor Deposition) apparatus, and thereafter air inside the reaction chamber is discharged until a vacuum of not higher than about $10^{-6}$ Torr is attained. Thereafter, by supplying silane ($SiH_4$) or disilane ($Si_2H_6$) gas with the substrate temperature set to about 550° C. to 600° C., a silicon thin line 17 is made to epitaxially grow on the exposed region located at the tips of the protruding portions 16 and 16 (shown in FIG. 3E). In this case, it is required to isolate the silicon thin line 17 from the silicon substrate 11 by oxidation in the subsequent process, and therefore, the silicon thin line 17 is made to grow wider than the width of the connection portion of the silicon substrate 11.

Next, as shown in FIG. 3G, the nitride film 13 (shown in FIG. 3F) and the first oxide film 15 (shown in FIG. 3F) are removed by wet etching with hydrofluoric acid, phosphoric acid or the like.

Finally, as shown in FIG. 3H, oxidation is performed to form an oxide film 15A between the silicon thin line 17 (shown in FIG. 3G) and the silicon substrate 11, consequently forming a silicon quantum thin line 17a isolated from the silicon substrate 11.

As described above, the third embodiment produces an effect similar to that of the first embodiment, by which the process of forming the resist in the region on the groove 12 of the nitride film 13 before the etchback of the nitride film 13 and forming the mask can be eliminated.

Fourth Embodiment

Figure 4:
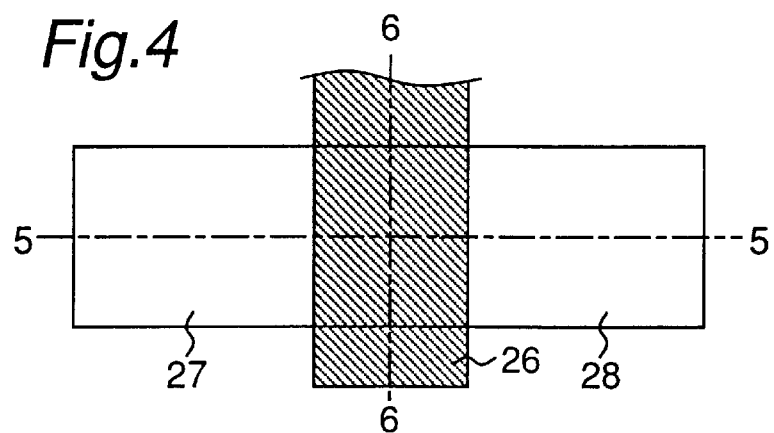
FIG. 4 is a plan view of a non-volatile memory that serves as a semiconductor device employing a quantum thin line according to a fourth embodiment of the present invention.
Figure 5:
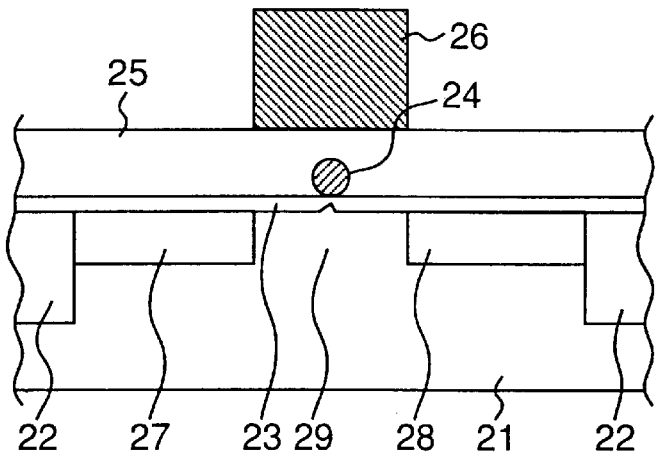
FIG. 5 is a sectional view taken along the line 5—5 in FIG. 4.

FIG. 4 is a plan view of a non-volatile memory (flash memory, EEPROM or the like) that serves as a semiconductor device employing a quantum thin line according to the fourth embodiment of the present invention, while FIG. 5 is a sectional view taken along the line 5—5 in FIG. 4.

As shown in FIG. 4 and FIG. 5, a rectangular region surrounded by an element isolation region 22 is formed on a silicon substrate 21. Roughly at the center of the region, a nanometer-size quantum thin line 24 is formed as a floating gate region on a tunnel oxide film 23 in the direction roughly perpendicular to the lengthwise direction of the region by means of the quantum thin line producing method of any one of the first through third embodiments.

Subsequently, a control gate insulating film 25 having a film thickness of 10 nm is formed on the tunnel oxide film 23 and the quantum thin line 24 by the CVD method. Next, a gate electrode 26 is formed on the control gate insulating film 25, and thereafter a source region 27 and a drain region 28 are formed by implanting impurity ions using the gate electrode 26 as a mask, consequently forming a channel region 29 between the source region 27 and the drain region 28. A non-volatile memory employing the quantum thin line 24 in the floating gate region located between the channel region 29 and the gate electrode 26 is constructed.

Figure 6:
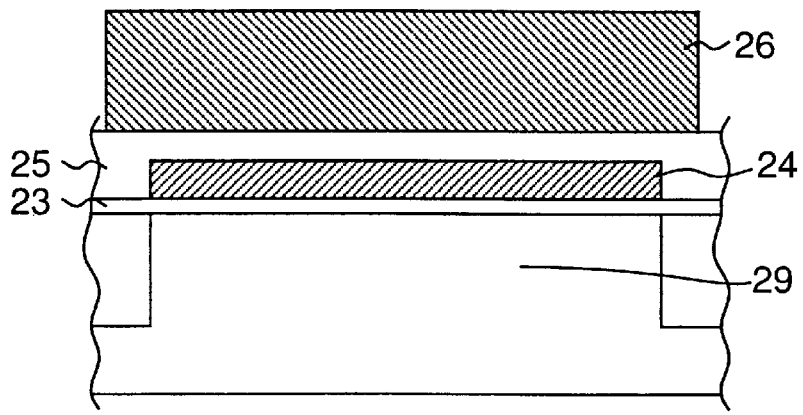
FIG. 6 is a sectional view taken along the line 6—6 in FIG. 4.

FIG. 6 is a sectional view taken along the line 6—6 in FIG. 4. The quantum thin line 24 is arranged so as to roughly perpendicularly cross a direction of the source region 27 and the drain region 28 shown in FIG. 4. As described above, the floating gate region 24 put between the control gate insulating film 25 that serves as a first insulating film and the tunnel oxide film 23 that serves as a second insulating film is formed between the channel region 29 and the gate electrode 26.

Therefore, by using the quantum thin line 24 for the floating gate region, the accumulated electric charges in the floating gate region can be reduced, allowing a non-volatile memory of a very small consumption of power, a super-high density and a large capacity to be provided.

It is to be noted that the quantum thin line 24 is not limited to silicon and is allowed to be made of another semiconductor material or another metal material. Therefore, by using the quantum thin line 24 for the floating gate region of a non-volatile memory, there can be provided a low-cost non-volatile memory or the like of a high yield and high productivity appropriate for mass production.

Fifth Embodiment

Figure 7:
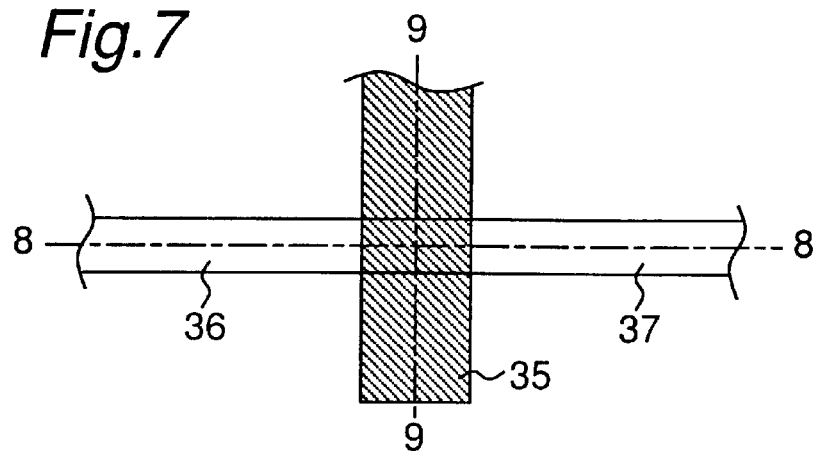
FIG. 7 is a plan view of a MOSFET that serves as a semiconductor device employing a quantum thin line according to a fifth embodiment of the present invention.
Figure 8:
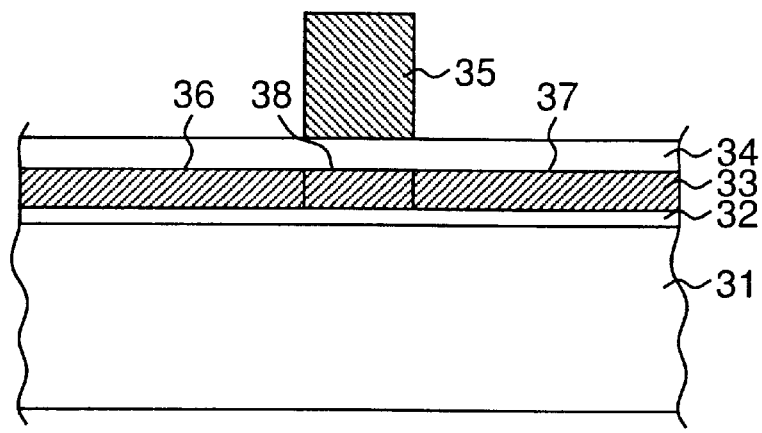
FIG. 8 is a sectional view taken along the line 8—8 in FIG. 7.

FIG. 7 is a plan view of a MOS (Metal Oxide Semiconductor) FET (Field Effect Transistor) that serves as a semiconductor device employing a quantum thin line according to the fifth embodiment of the present invention. FIG. 8 is a sectional view taken along the line 8—8 in FIG. 7, while FIG. 9 is a sectional view taken along the line 9—9 in FIG. 7.

Figure 9:
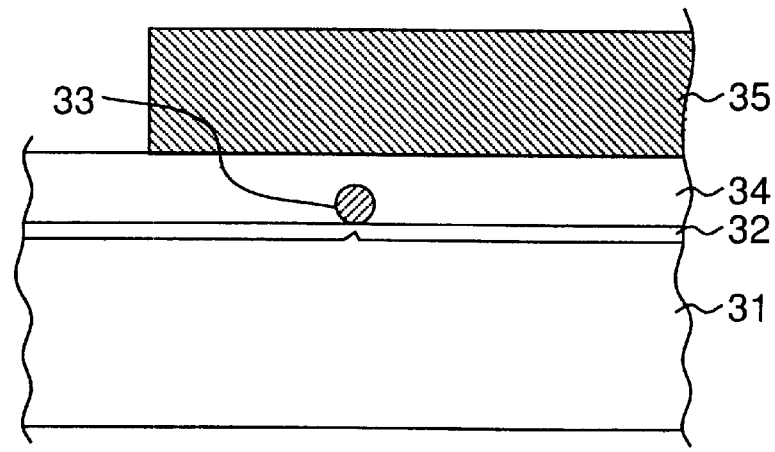
FIG. 9 is a sectional view taken along the line 9—9 in FIG. 7.

As shown in FIG. 7, FIG. 8 and FIG. 9, a quantum thin line 33 is formed via an insulating layer 32 on a silicon substrate 31 according to any one of the first through third embodiments. Subsequently, a gate insulating film 34 having a film thickness of 30 nm is formed on the insulating layer 32 and the quantum thin line 33 by the CVD method. Then, after the formation of a gate electrode 35 on the gate insulating film 34, impurity ions are implanted using the gate electrode 35 as a mask, forming a source region 36 and a drain region 37 in the quantum thin line 33. A portion between the source region 36 and the drain region 37 of the quantum thin line 33 becomes a channel region 38. Then, by making the quantum thin line 33 have a width of not greater than 10 nm, the channel region 38 is quantized in the direction perpendicular to the lengthwise direction of the quantum thin line 33, as a consequence of which linear conduction is attained for the obtainment of a super-high-speed MOSFET.

Therefore, by using a portion of the quantum thin line 33 for the channel region 38, a super-high-speed transistor or the like of a high yield and high productivity appropriate for mass production can be provided at low cost.

Sixth Embodiment

Figure 10:
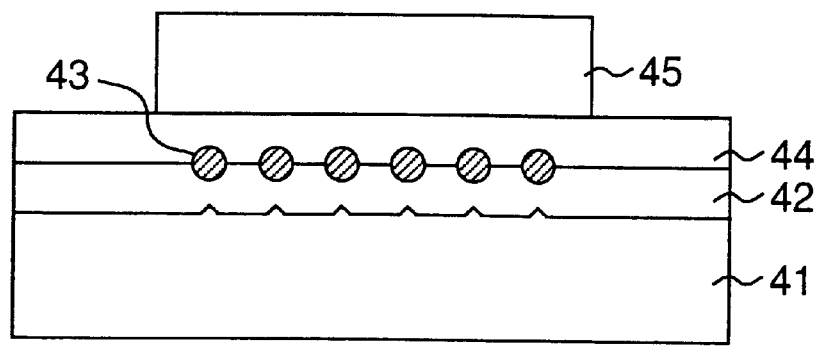
FIG. 10 is a sectional view of a light-emitting device that serves as a semiconductor device employing a quantum thin line according to a sixth embodiment of the present invention.

FIG. 10 is a sectional view of a light-emitting device that serves as a semiconductor device employing a quantum thin line according to the sixth embodiment of the present invention.

As shown in FIG. 10, a plurality of quantum thin lines 43 having a diameter of not greater than 10 nm are formed roughly parallel to one another at set intervals on an insulating layer 42 on a silicon substrate 41 by means of any one of the first through third embodiments. Then, a gate insulating film 44 having a film thickness of 30 nm is formed on the insulating layer 42 and the quantum thin lines 43 by the CVD method, and a transparent gate electrode (ITO (Indium Tin Oxide)) 45 is further formed on the gate insulating film 44. In this stage, by virtue of the quantum confining effect, the quantum thin lines 43 have a direct transition type band structure in which the semiconductor forbidden bandwidth of any one of the plurality of quantum thin lines 43, the one quantum thin line being located inside, is made smaller than the energy gap of the forbidden bandwidth of the quantum thin lines located on both sides of the one quantum thin line, providing a double hetero structure in which the efficiency of reunion of an electron with a hole is high. Then, a tunnel current flows in the insulating film 42 and the gate insulating film 44 by applying a voltage across the gate electrode 45 and the silicon substrate 41, as a consequence of which electrons are injected into the quantum thin lines 43 by the tunnel current. Consequently, electron transition occurs in the quantum thin lines 43, causing light emission.

By using the quantum thin lines 43 made of silicon, a light-emitting device of a high yield and high productivity appropriate for mass production can be provided at low cost. It is to be noted that the number of the quantum thin lines 43 is required to be not smaller than three.

Seventh Embodiment

Figure 11:
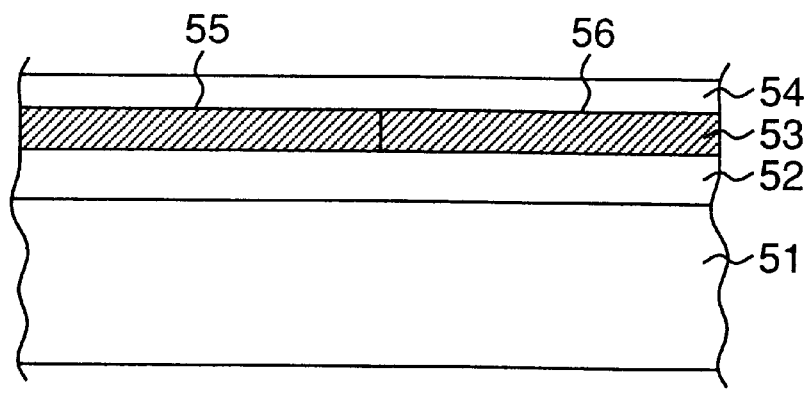
FIG. 11 is a sectional view of a light-emitting device that serves as a semiconductor device employing a quantum thin line according to a seventh embodiment of the present invention.
Figure 12:
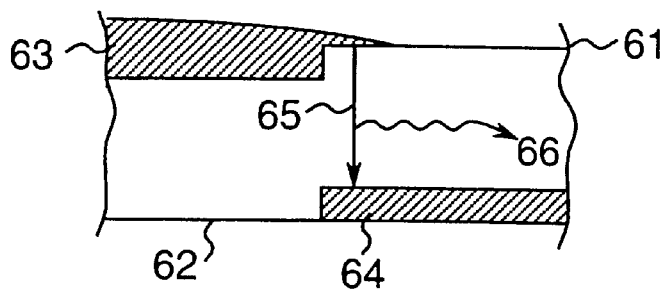
FIG. 12 is a view showing a band structure of FIG. 11.

FIG. 11 is a sectional view of a light-emitting device that serves as a semiconductor device employing a quantum thin line according to the seventh embodiment of the present invention. As shown in FIG. 11, a plurality of quantum thin lines 53 having a diameter of not greater than 10 nm are formed on an insulating layer 52 on a silicon substrate 51 by means of any one of the first through third embodiments. Then, an insulating film 54 is formed by the CVD method. Further, an n-type impurity region 55 is formed by implanting n-type impurity ions into a portion of the quantum thin lines 53 by means of a photoresist mask (not shown). Likewise, a p-type impurity region 56 is formed by implanting p-type impurity ions into a portion of the quantum thin lines 53 that is other than the n-type impurity region. The quantum thin lines 53 have a direct transition type band structure by virtue of the quantum confining effect, and a pn junction is formed in the boundary region located between the n-type impurity region 55 and the p-type impurity region 56 of the quantum thin lines 53. Therefore, a pn junction band structure is formed as shown in FIG. 12. In FIG. 12, a conduction band 61, a valence band 62, an electron 63 and a hole 64 are shown. Then, by applying a voltage across the n-type impurity region 55 (shown in FIG. 11) and the p-type impurity region 56 (shown in FIG. 11), reunion 65 of an electron with a hole occurs in the pn junction portion, causing light emission (66 in FIG. 12). By using the above quantum thin lines 53 made of silicon, a light-emitting device of a high yield and high productivity appropriate for mass production can be provided at low cost.

Eighth Embodiment

FIGS. 13A through 13E are plan process charts of a light-emitting device that serves as a semiconductor device employing a quantum thin according to the eighth embodiment of the present invention.

Figure 13A:
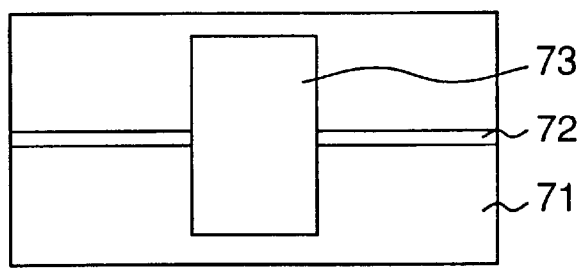
FIGS. 13A through 13E are process charts showing a quantum thin line producing method according to an eighth embodiment of the present invention.

First, as shown in FIG. 13A, an exposed region 72 is formed on a silicon substrate 71 by means of the quantum thin line producing method of any one of the first through third embodiments. The surface of the silicon substrate 71 is covered with an insulating layer (not shown) except for the exposed region 72 of the silicon substrate 71. Next, the exposed region 72 of the silicon substrate 71 is partially covered with a first insulating layer 73 made of a material different from that of the aforementioned insulating layer.

Figure 13B:
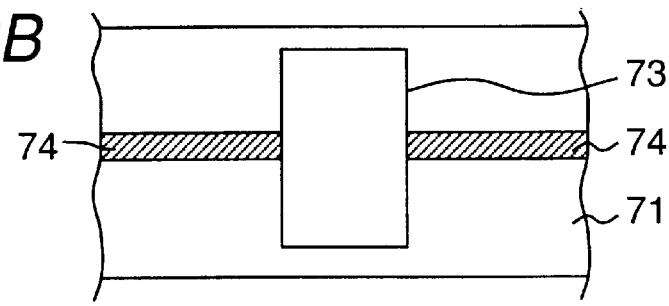

Next, as shown in FIG. 13B, a silicon thin line portion 74 is made to grow in the exposed region 72 (shown in FIG. 13A) that belongs to the silicon substrate 71 and is not covered with the first insulating film 73 by means of the quantum thin line producing method of any one of the first through third embodiments.

Figure 13C:
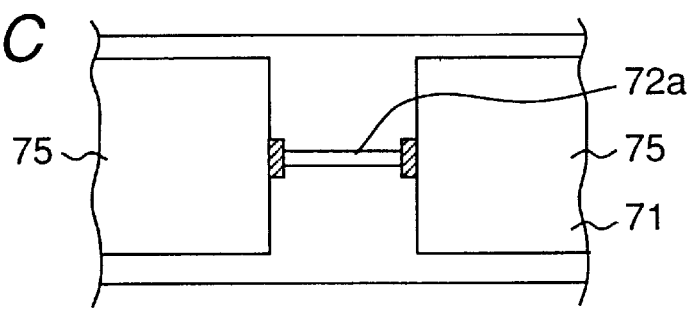

Next, as shown in FIG. 13C, after the removal of the first insulating film 73 (shown in FIG. 13A), an exposed region 72a of the silicon substrate 71 that has been covered with the first insulating film 73 is exposed again, and a second insulating layer 75 made of the same material as that of the first insulating layer 73 is formed so as to cover the silicon thin line portion 74.

Figure 13D:
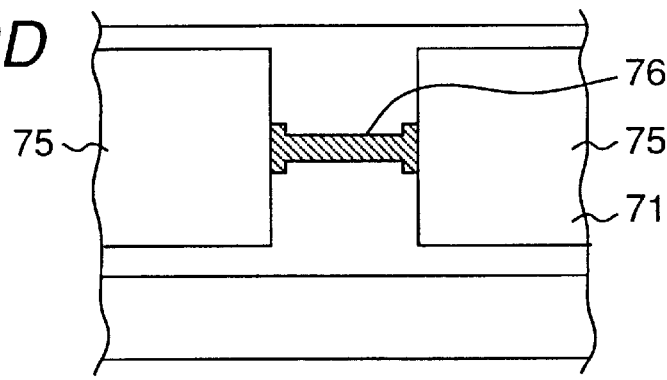

Next, as shown in FIG. 13D, a SiGe thin line portion 76 is made to grow in the exposed region 72a (shown in FIG. 13C) of the silicon substrate 71 that is not covered with the second insulating layer 75 using monosilane ($SiH_4$) and monogermane ($GeH_4$) as material gases by means of the quantum thin line producing method of any one of the first through third embodiments.

Figure 13E:
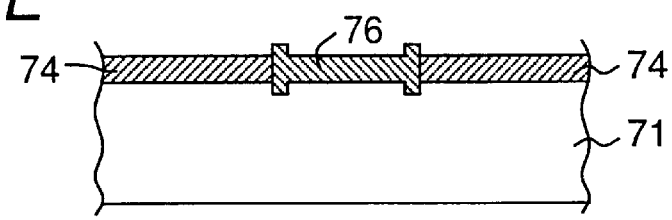

Next, as shown in FIG. 13E, after the removal of the second insulating film 75 (shown in FIG. 13D), appropriate ions are implanted into the SiGe thin line portion 76, a silicon thin line portion 74 located on the left-hand side of the SiGe thin line portion 76 and a silicon thin line 74 located on the right-hand side of the SiGe thin line portion 76.

Figure 14:
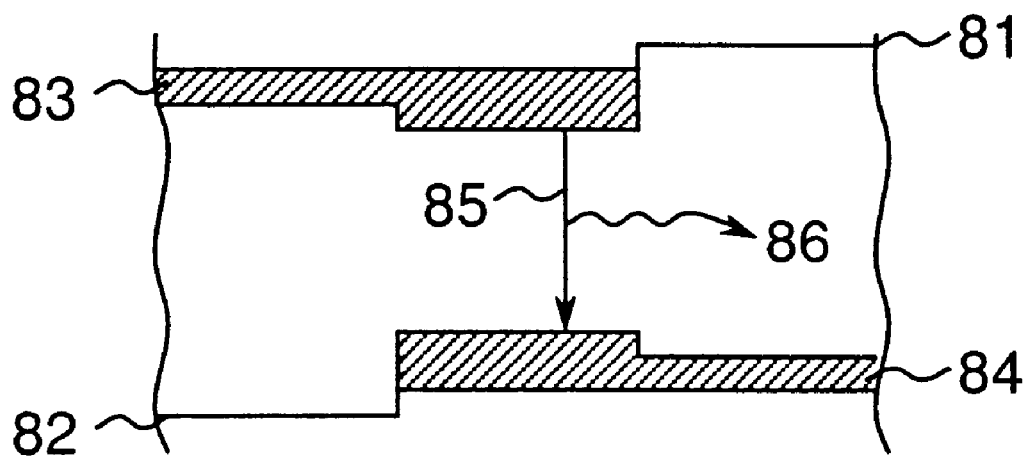
FIG. 14 is a view showing a band structure of a light-emitting device of the eighth embodiment.
Figure 15A:
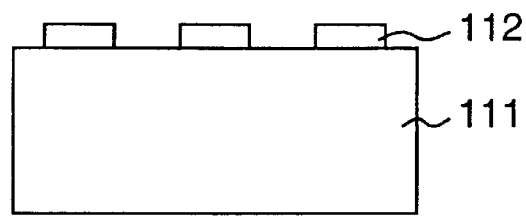
FIGS. 15A through 15F are process charts showing a silicon quantum thin line producing method according to a conventional quantum thin line producing method.
Figure 15B:
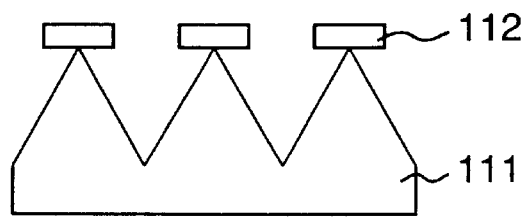
Figure 15C:
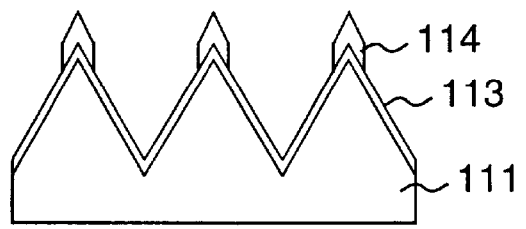
Figure 15D:
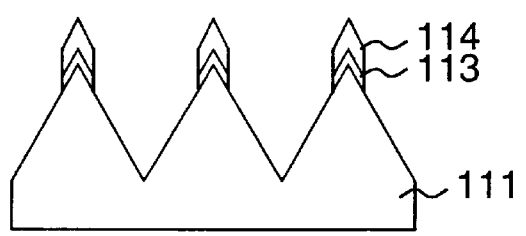
Figure 15E:
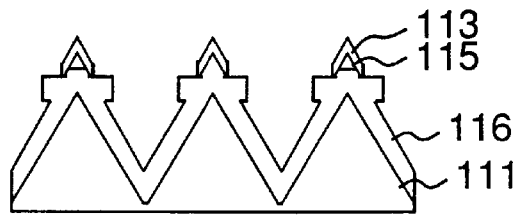
Figure 15F:
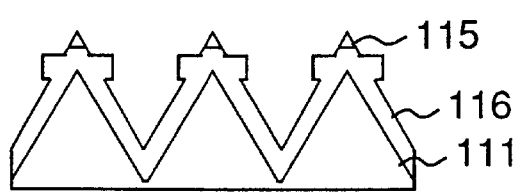
Figure 16A:
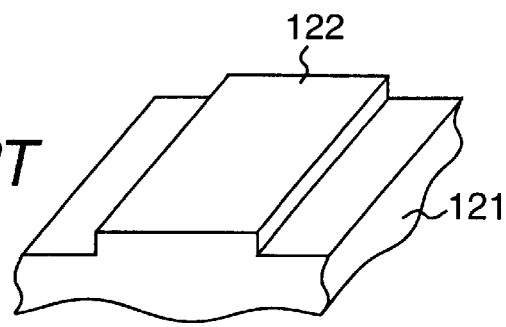
FIGS. 16A through 16G are process charts showing a silicon quantum thin line producing method using two silicon wafers according to a conventional quantum thin line producing method.
Figure 16B:
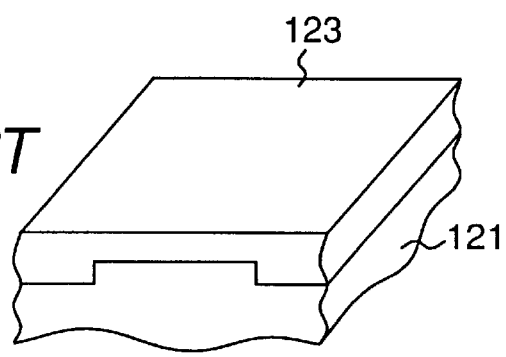
Figure 16C:
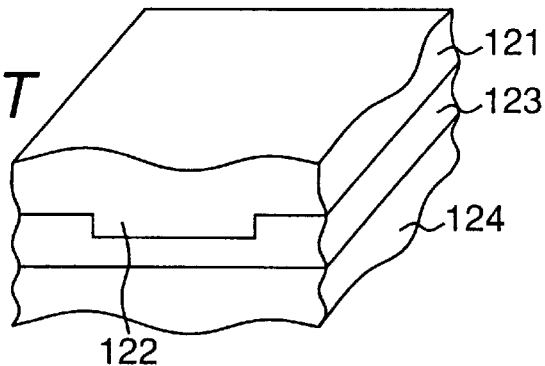
Figure 16D:
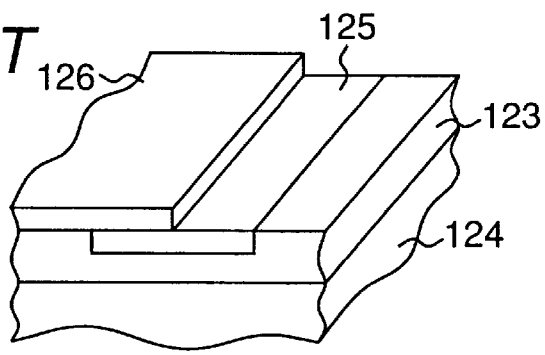
Figure 16E:
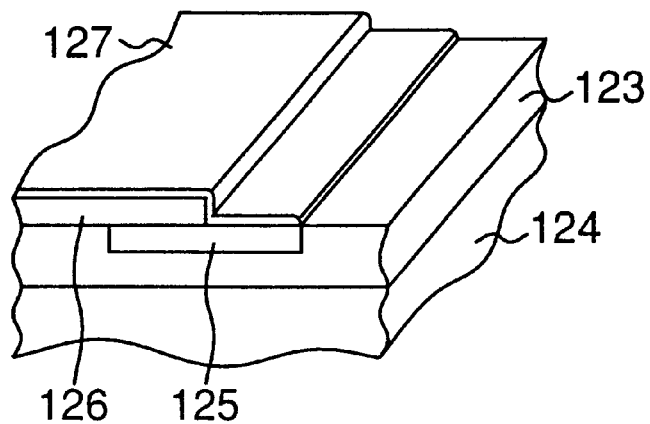
Figure 16F:
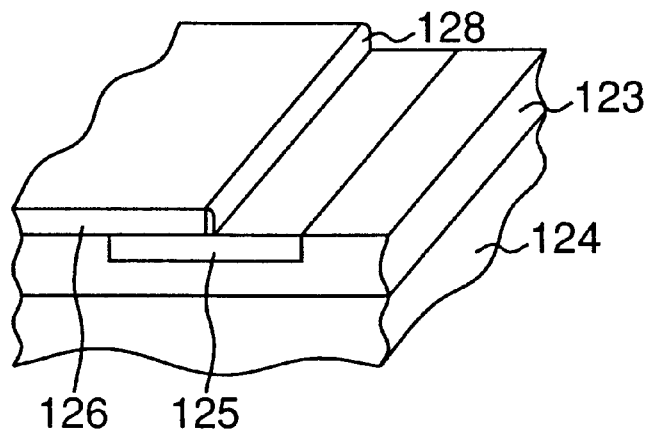
Figure 16G:
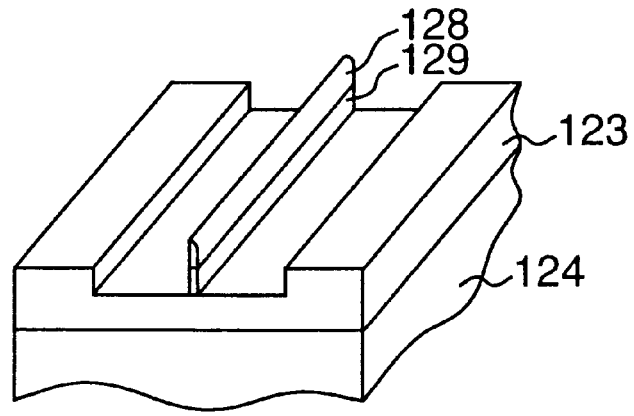

FIG. 14 shows the band structure of the above light-emitting device. In FIG. 14, the reference numeral 81 denotes a conduction band and the reference numeral 82 denotes a valence band. The aforementioned SiGe, having a smaller band gap than that of silicon, has a double hetero structure, in which an electron 83 and a hole 84 are concentrated on the SiGe thin line portion 76 (shown in FIG. 13E). Therefore, reunion 85 of an electron with a hole efficiently occurs, causing light emission (86 in FIG. 14).

As described above, a light-emitting device of a high yield and high productivity appropriate for mass production can be provided at low cost by using the quantum thin line portion 74 made of silicon and the quantum thin line portion 76 made of SiGe.

Although the silicon substrate is employed as a semiconductor substrate in the first through eighth embodiments, the semiconductor substrate is not limited to this and allowed to be made of a semiconductor material other than silicon.

Although disilane ($Si_2H_6$) is employed as a material gas when the material of the quantum thin line is silicon Si in the first through eighth embodiments, it is acceptable to use any one of monosilane ($SiH_4$), trisilane ($Si_3H_8$), dichlorosilane ($SiH_2Cl_2$) and tetrachlorosilane ($SiCl_4$).

When the quantum thin line is made of germanium Ge, it is acceptable to use any one of monogermane ($GeH_4$), digermane ($Ge_2H_6$) and germanium tetrafluoride ($GeF_4$) as a material gas.

When the quantum thin line is made of silicon germanium SiGe, it is acceptable to use a mixed gas comprised of the gas of any one of monosilane ($SiH_4$), disilane ($Si_2H_6$), trisilane ($Si_3H_8$), dichlorosilane ($SiH_2Cl_2$) and tetrachlorosilane ($SiCl_4$) and the gas of any one of monogermane ($GeH_4$), digermane ($Ge_2H_6$) and germanium tetrafluoride ($GeF_4$) as a material gas.

According to the first through fourth embodiments and sixth embodiments, when the quantum thin line is made of aluminum Al, it is acceptable to use an organic aluminum of DMAH (($CH_3$)$_2$AlH) or the like.

It is to be noted that the material of the quantum thin line is limited neither to the semiconductor of silicon Si, germanium Ge or silicon germanium SiGe nor to the metal of aluminum Al.

The quantum thin line producing method of the present invention, capable of forming a superfine thin line of a conductive material without using any special fine processing apparatus, can also be applied to the wiring of a high-density LSI.

The semiconductor device having a quantum thin line that becomes the basis of a quantum effect device and a single electron device and is produced by the quantum thin line producing method of the present invention can be mounted on the same substrate as that of a silicon-based large-scale integrated circuit. By applying this semiconductor device to a light-emitting device or a photoelectric transducing device, an electronic circuit and an optical communication circuit can be combined with each other.

As is apparent from the above, the quantum thin line producing method of the first aspect of the present invention is not limited to the case of SOI (silicon on insulator) and is allowed to be applied to a silicon substrate that has been conventional used. Therefore, a quantum thin line can be formed by using a silicon substrate at low cost. The oxidation is performed after the growth of the silicon thin line for the isolation of the silicon thin line from the substrate silicon, and therefore, the bottom surface side of the quantum thin line is not put in contact with the semiconductor substrate, providing a complete electron confining region. Furthermore, only one silicon substrate is used, and therefore, the silicon thin line can be formed without requiring the special substrate forming technique of sticking two silicon substrates on each other via the insulating layer. The linear protruding portion can be formed on the semiconductor substrate by means of the general film forming technique, lithographic technique and etching technique, and the exposed portion can be formed at the top of the protruding portion. This enables the positional control of the quantum thin line and the formation of a quantum thin line on a relatively flat semiconductor substrate. Therefore, a single electron transistor can be easily formed. Since no special fine processing technique is used, there can be provided a quantum thin line producing method of a high yield and high productivity appropriate for mass production at reduced producing cost.

The quantum thin line producing method of the second aspect of the present invention has the same effects as those of the first aspect. Further, by performing the formation and etchback of the second nitride film after the dry etching of the first nitride film, the positional control margin of the photoresist in the etching stage of the first nitride film can be approximately doubled, as compared with the first aspect of the present invention.

According to the quantum thin line producing method of the third aspect of the present invention, in addition to the effects of the first aspect of the present invention, the process for forming a resist and forming a mask before the etchback of the nitride film can be eliminated, also allowing the producing cost to be reduced.

According to the quantum thin line producing method of one embodiment, the semiconductor substrate is introduced into the reaction chamber in the process for forming a quantum thin line at the top of the protruding portion of the semiconductor substrate and air is discharged so that the reaction chamber comes to have a high vacuum of not higher than $10^{-6}$ Torr. Thereafter, a material gas is flowed into the reaction chamber and vapor growth of the quantum thin line is performed only in the exposed region of the semiconductor substrate under a material gas partial pressure of not higher than $10^{-2}$ Torr. Therefore, by controlling the degree of vacuum inside the reaction chamber, the amount of material gas to be introduced, the time of introduction, the substrate temperature and so on by means of a general high-vacuum CVD apparatus, the quantum thin line of the desired size can be uniformly formed with high reproducibility.

According to the quantum thin line producing method of one embodiment, the quantum thin line is made of silicon, and any one of monosilane ($SiH_4$), disilane ($Si_2H_6$), trisilane ($Si_3H_8$), dichlorosilane ($SiH_2Cl_2$) and tetrachlorosilane ($SiCl_4$) is used as a material gas. Therefore, reaction is caused by the general CVD apparatus, allowing a quantum thin line made of silicon to be formed only in the exposed region located at the tip or top of the linear protruding portion of the semiconductor substrate.

According to the quantum thin line producing method of one embodiment, the quantum thin line is made of germanium, and any one of monogermane ($GeH_4$), digermane ($Ge_2H_6$) and germanium tetrafluoride ($GeF_4$) is used as a material gas. Therefore, reaction is caused by the general CVD apparatus, allowing a quantum thin line made of germanium to be formed only in the exposed region located at the tip or top of the linear protruding portion of the semiconductor substrate.

According to the quantum thin line producing method of one embodiment, the quantum thin line is made of silicon germanium, and a mixed gas comprised of the gas of any one of monosilane ($SiH_4$), disilane ($Si_2H_6$), trisilane ($Si_3H_8$), dichlorosilane ($SiH_2Cl_2$) and tetrachlorosilane ($SiCl_4$) and the gas of any one of monogermane ($GeH_4$), digermane ($Ge_2H_6$) and germanium tetrafluoride ($GeF_4$) is used as a material gas. Therefore, reaction is caused by the general CVD apparatus, allowing a quantum thin line made of silicon germanium to be formed only in the exposed region located at the tip of the linear protruding portion of the semiconductor substrate.

According to the quantum thin line producing method of one embodiment, the quantum thin line is made of aluminum, and an organic aluminum is used as a material. Therefore, reaction is caused by the general CVD apparatus, allowing a quantum thin line made of aluminum to be formed only in the exposed region located at the tip of the linear protruding portion of the semiconductor substrate.

According to the semiconductor device employing the quantum thin line of one embodiment, the quantum thin line made of a semiconductor (or metal) formed by the above quantum thin line producing method is made to serve as the floating gate region. With this arrangement, the electric charge accumulation is reduced and the amount of electric charges to be injected into the floating gate region is reduced. This enables the provision of a non-volatile memory of a small consumption of power, a high density and a large capacity. A non-volatile memory of a high yield and high productivity appropriate for mass production can be obtained at low cost. Furthermore, the semiconductor device employing the quantum thin line of the present invention can be mounted on the same substrate as that of a silicon-based large-scale integrated circuit as a semiconductor device having a quantum thin line that becomes the basis of a single electron device.

According to the semiconductor device employing the quantum thin line of one embodiment, the quantum thin line made of a semiconductor (or metal) formed by the above quantum thin line producing method is made to serve as the channel region. With this arrangement, the channel region is quantized in the direction perpendicular to the lengthwise direction of the thin line, exhibiting linear conduction. Therefore, a transistor that can operate at a super high speed can be obtained, allowing a super-high-speed transistor of a high yield and high productivity appropriate for mass production to be obtained at low cost. The semiconductor device employing the quantum thin line of the embodiment can be mounted on the same substrate as that of a silicon-based large-scale integrated circuit as a semiconductor device having a quantum thin line that becomes the basis of a quantum effect device.

According to the semiconductor device employing the quantum thin line of one embodiment, by virtue of the quantum confining effect obtained by interposing the quantum thin line formed by the aforementioned quantum thin line producing method between the insulating film portions and further interposing the insulating film portions between the electrodes, the quantum thin line comes to have the direct transition type band structure. If a voltage is applied across the electrodes to flow a tunnel current for the injection of electrons into the quantum thin line, then electron transition occurs in the quantum thin line, causing light emission. Therefore, a light-emitting device of a high yield and high productivity appropriate for mass production can be provided at low cost. Furthermore, the semiconductor device employing the quantum thin line of the embodiment can be mounted on the same substrate as that of a silicon-based large-scale integrated circuit as a semiconductor device having a quantum thin line that becomes the basis of a quantum effect device or a single electron device. By applying this semiconductor device to a light-emitting device or a photoelectric transducing device, an electronic circuit and an optical communication circuit can be combined with each other.

According to the semiconductor device employing the quantum thin line of one embodiment, one portion of the quantum thin line formed by the above quantum thin line producing method is made of the n-type semiconductor and the other portion of the quantum thin line is made of the p-type semiconductor. The quantum thin line has the direct transition type band structure by virtue of the quantum confining effect. A pn junction is formed in the boundary region between the n-type semiconductor and the p-type semiconductor of the quantum thin line. Therefore, by applying a voltage across the n-type semiconductor and the p-type semiconductor, reunion of an electron with a hole occurs in the pn junction portion, causing light emission. Therefore, a light-emitting device of a high yield and high productivity appropriate for mass production can be provided at low cost. Furthermore, the semiconductor device employing the quantum thin line of the embodiment can be mounted on the same substrate as that of a silicon-based large-scale integrated circuit as a semiconductor device having a quantum thin line that becomes the basis of a quantum effect device or a single electron device. By applying this semiconductor device to a light-emitting device or a photoelectric transducing device, an electronic circuit and an optical communication circuit can be combined with each other.

According to the semiconductor device employing the quantum thin line of one embodiment, the semiconductor forbidden bandwidth of any one of the three or more quantum thin lines formed by the aforementioned quantum thin line producing method, the one quantum thin line being located inside, is made smaller than the energy gap of the forbidden bandwidth of the quantum thin lines located on both sides of the one quantum thin line. The quantum thin line comes to have the direct transition type band structure by virtue of the quantum confining effect and also the double hetero structure in which the efficiency of reunion of an electron with a hole is high due to the fact that the energy gap of the forbidden bandwidth is smaller than that of the quantum thin lines located on both sides. Therefore, by applying a voltage across the quantum thin lines located on both sides, the reunion of an electron with a hole occurs in the quantum thin line located inside, causing light emission.

Therefore, a light-emitting device of a high yield and high productivity appropriate for mass production can be provided at low cost. Furthermore, the semiconductor device employing the quantum thin line of the embodiment can be mounted on the same substrate as that of a silicon-based large-scale integrated circuit as a semiconductor device having a quantum thin line that becomes the basis of a quantum effect device or a single electron device. By applying this semiconductor device to a light-emitting device or a photoelectric transducing device, an electronic circuit and an optical communication circuit can be combined with each other.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device having a source region, a drain region, a channel region located between the source region and the drain region, a gate region for controlling a channel current flowing through the channel region, a floating gate region located between the channel region and the gate region, a first insulating film located between the floating gate region and the gate region and a second insulating film located between the channel region and the floating gate region, the floating gate region being comprised of a quantum thin line formed by the steps of:

forming a stepped portion on a semiconductor substrate;

forming a nitride film on an upper portion and a lower portion of the semiconductor substrate by which the stepped portion is formed;

masking a region of the nitride film which covers the lower portion of the semiconductor substrate and etching back the nitride film, consequently exposing the upper portion of the semiconductor substrate;

forming a first oxide film by oxidizing the exposed upper portion of the semiconductor substrate and forming a linear protruding portion on the semiconductor substrate along a side surface of the nitride film;

partially etching the first oxide film located on the protruding portion of the semiconductor substrate, consequently exposing a tip of the protruding portion;

epitaxially growing a thin line portion on an exposed region of the tip of the protruding portion of the semiconductor substrate;

removing the nitride film and the first oxide film after the epitaxial growth of the thin line portion; and forming a quantum thin line isolated from the semiconductor substrate by a second oxide film formed by oxidizing the semiconductor substrate after the removal of the nitride film and the first oxide film.

2. A semiconductor device having a source region, a drain region, a channel region located between the source region and the drain region, a gate region for controlling a channel current flowing through the channel region, a floating gate region located between the channel region and the gate region, a first insulating film located between the floating gate region and the gate region and a second insulating film located between the channel region and the floating gate region, the floating gate region being comprised of a quantum thin line formed by the steps of:

forming a stepped portion on a semiconductor substrate;

forming a first nitride film on an upper portion and a lower portion of the semiconductor substrate by which the stepped portion is formed;

masking a region of the first nitride film which covers the lower portion of the semiconductor substrate and etching back the first nitride film, consequently exposing the upper portion of the semiconductor substrate;

forming a second nitride film on the exposed upper portion of the semiconductor substrate and the first nitride film and then performing etching back, consequently exposing the upper portion of the semiconductor substrate;

forming a first oxide film by oxidizing the exposed upper portion of the semiconductor substrate and forming a linear protruding portion on the semiconductor substrate along a side surface of the first nitride film;

partially etching the first oxide film located on the protruding portion of the semiconductor substrate, consequently exposing a tip of the protruding portion;

epitaxially growing a thin line portion on an exposed region located at a tip of the protruding portion of the semiconductor substrate;

removing the first and second nitride films and the first oxide film after the epitaxial growth of the thin line portion; and forming a quantum thin line isolated from the semiconductor substrate by a second oxide film formed by oxidizing the semiconductor substrate after the removal of the first and second nitride films and the first oxide film.

3. A semiconductor device having a source region, a drain region, a channel region located between the source region and the drain region, a gate region for controlling a channel current flowing through the channel region, a floating gate region located between the channel region and the gate region, a first insulating film located between the floating gate region and the gate region and a second insulating film located between the channel region and the floating gate region, the floating gate region being comprised of a quantum thin line formed by the steps of:

forming a groove having a rectangular cross-section shape on a semiconductor substrate;

forming a nitride film on the semiconductor substrate on which the groove is formed;

etching back the nitride film, consequently exposing both side portions of the semiconductor substrate located on both sides of the groove;

forming a first oxide film by oxidizing the exposed region of the semiconductor substrate located on both sides of the groove and forming linear protruding portions on the semiconductor substrate along both side surfaces of the first nitride film;

partially etching the first oxide film located on both protruding portions of the semiconductor substrate, consequently exposing tips of both the protruding portions;

epitaxially growing thin line portions on exposed portions located at the tips of both the protruding portions of the semiconductor substrate;

removing the nitride film and the first oxide film after the epitaxial growth of the thin line portions; and forming quantum thin lines isolated from the semiconductor substrate by a second oxide film formed by oxidizing the semiconductor substrate after the removal of the nitride film and the first oxide film.

* * * * *